United States Patent
Li et al.

(10) Patent No.: US 6,804,808 B2
(45) Date of Patent: Oct. 12, 2004

(54) REDUNDANT VIA RULE CHECK IN A MULTI-WIDE OBJECT CLASS DESIGN LAYOUT

(75) Inventors: Mu-Jing Li, Sunnyvale, CA (US); Amy Yang, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 200 days.

(21) Appl. No.: 10/260,817

(22) Filed: Sep. 30, 2002

(65) Prior Publication Data

US 2004/0063228 A1 Apr. 1, 2004

(51) Int. Cl.⁷ .............................................. G06F 17/50
(52) U.S. Cl. ............................................... 716/5; 716/4
(58) Field of Search ........................................ 716/4, 5

(56) References Cited

U.S. PATENT DOCUMENTS

| | | | |
|---|---|---|---|
| 5,620,916 A | 4/1997 | Eden et al. | |
| 5,689,435 A | 11/1997 | Umney et al. | |
| 5,706,295 A | 1/1998 | Suzuki | |
| 5,798,937 A | * 8/1998 | Bracha et al. | 716/9 |
| 5,926,723 A | 7/1999 | Wang | |
| 5,970,238 A | 10/1999 | Shibata et al. | |
| 6,011,911 A | 1/2000 | Ho et al. | |
| 6,026,224 A | * 2/2000 | Darden et al. | 716/10 |
| 6,063,132 A | 5/2000 | DeCamp et al. | |
| 6,078,737 A | 6/2000 | Suzuki | |
| 6,189,136 B1 | 2/2001 | Bothra | |
| 6,209,123 B1 | 3/2001 | Maziasz et al. | |
| 6,275,971 B1 | 8/2001 | Levy et al. | |
| 6,324,673 B1 | 11/2001 | Luo et al. | |
| 6,370,679 B1 | 4/2002 | Chang et al. | |
| 6,374,395 B1 | 4/2002 | Wang | |
| 6,378,110 B1 | 4/2002 | Ho | |
| 6,446,873 B1 | 9/2002 | Geryk | |
| 6,457,163 B1 | 9/2002 | Yang | |
| 6,461,877 B1 | 10/2002 | Holloway et al. | |
| 6,484,302 B1 | 11/2002 | Freymuth | |
| 6,487,706 B1 | 11/2002 | Barkley et al. | |
| 6,536,023 B1 | 3/2003 | Mohan et al. | |
| 6,606,735 B1 | 8/2003 | Richardson et al. | |
| 6,611,946 B1 | 8/2003 | Richardson et al. | |
| 6,637,013 B1 | 10/2003 | Li | |
| 6,718,527 B2 | * 4/2004 | Li | 716/5 |
| 2002/0127479 A1 | 9/2002 | Pierrat | |
| 2002/0174413 A1 | 11/2002 | Tanaka | |
| 2003/0061583 A1 | 3/2003 | Malhotra | |
| 2003/0088843 A1 | 5/2003 | Mehrotra et al. | |
| 2003/0182644 A1 | 9/2003 | Li et al. | |

(List continued on next page.)

OTHER PUBLICATIONS

Yu Chen et al., "Hierarchical Dummy Fill for Process Uniformity," Proc. Asia and South Pacific Design Automation Conf, Jan. 2001, pp. 139–144.

(List continued on next page.)

*Primary Examiner*—Stacy Whitmore
*Assistant Examiner*—Brandon Bowers
(74) *Attorney, Agent, or Firm*—Zagorin, O'Brien & Graham, LLP

(57) ABSTRACT

A redundant via design rule check is preferably performed on multi-wide object class design layouts to ensure that each connection area between two conductive layers has at least a certain number of vias and/or has vias placed appropriately to reduce the risk of via failure due to vacancy concentration of isolated vias. In exemplary embodiments, a redundant via design rule check preferably ensures that for vias placed within a connection area of a metal feature (or within a localized region of a larger metal geometry) that is both greater than a certain width and greater than a certain area in size, the vias are both sufficient in number and/or suitable in their location. Vias located inside a geometry but falling outside a virtual edge of a wide class object may be included to satisfy exemplary rules.

46 Claims, 3 Drawing Sheets

U.S. PATENT DOCUMENTS

| | | |
|---|---|---|
| 2003/0196180 A1 | 10/2003 | Li et al. |
| 2003/0229860 A1 | 12/2003 | Li |
| 2003/0229862 A1 | 12/2003 | Li et al. |
| 2004/0019862 A1 | 1/2004 | Li et al. |
| 2004/0019866 A1 | 1/2004 | Li |
| 2004/0019867 A1 | 1/2004 | Li |
| 2004/0019868 A1 | 1/2004 | Li |
| 2004/0025125 A1 | 2/2004 | Li |
| 2004/0064795 A1 | 4/2004 | Li et al. |
| 2004/0064796 A1 | 4/2004 | Li |
| 2004/0064797 A1 | 4/2004 | Li |

OTHER PUBLICATIONS

Andrew B. Kahng et al., "Filling Algorithms and Analyses for Layout Density Control," IEEE Trans. Computer Aided Design 18(4) (1999) pp. 445–462.

Barnes, "SKILL: A CAD System Extension Language," 1990 27$^{th}$ ACM/EEE Design Automation Conference, pp. 266–271.

Karam et al., "High Level CAD Melds Microsystems with Foundries," 1996 European Design and Test Conference, pp. 442–447.

Luo et al., "An Edge–Endpoint–Based Configurable Hardware Architecture for VLSI CAD Layout Design Rule Checking, " 1999 7$^{th}$ Annual IEEE Symposium on Field-Programmable Custom Computing Machines, pp. 158–167.

Diva Verification, http://www.cadence.com/datasheets/diva.html 2002 Cadence Design Systems, Inc., downloaded May 17, 2002, 3 pages.

\* cited by examiner

US 6,804,808 B2

REDUNDANT VIA RULE CHECK IN A MULTI-WIDE OBJECT CLASS DESIGN LAYOUT

CROSS-REFERENCE TO RELATED APPLICATION(S)

This application is related to the following co-pending commonly-assigned U.S. Patent Applications, each filed on even date herewith, and each hereby incorporated by reference in its entirety: U.S. application Number Ser. No. 10/260,814 by Mu-Jing Li, entitled "Correction of Spacing Violations Between Pure Fill Via Areas in a Multi-Wide Object Class Design Layout"; U.S. Application Number Ser. No. 10/260,816 by Mu-Jing Li, entitled "Pure Fill Via Area Extraction in a Multi-Wide Object Class Design Layout"; and U.S. Application Number Ser. No. 10/260,811 by Mu-Jing Li and Amy Yang, entitled "Via Enclosure Rule Check in a Multi-Wide Object Class Design Layout"; and U.S. application Ser. No. 10/260,813 by Mu-Jing Li and Amy Yang, entitled "Structure and Method for Separating Geometries in a Design Layout into Multi-Wide Object Classes".

BACKGROUND

1. Field of the Invention

The present invention relates to error checking and manipulation of a design layout, and more particularly to computer aided design layout and design rule verification of an integrated circuit design layout, and use thereof for circuit fabrication.

2. Background of the Invention

Design of an electronic circuit, for example, an integrated circuit (IC), is a complicated and time consuming process. FIG. 1 illustrates a typical design flow 80 of an integrated circuit device from conception through the generation of a fabrication ready design layout. Generally, design flow 80 commences with defining the design specifications or requirements, such as required functionality and timing, at step 82. The requirements of the design are implemented, for example, as a netlist or electronic circuit description, at step 84. The implementation can be performed by, for example, schematic capture (drawing the design with a computer aided design tool) or more typically, utilizing a high level description language such as VHDL, Verilog® and the like. The implemented design is simulated to verify design accuracy, at step 86. Design implementation and simulation are iterative processes. For example, errors found by simulation are corrected by design implementation and re-simulated.

Once the design is verified for accuracy with simulation, a design layout of the design is created, at step 88. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), at step 90. The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, at step 92. The extracted circuit identifies individual transistors and interconnections, for example, on various layers, as well as the parasitic resistances and capacitances present between the layers. A layout versus schematic check (LVS) is performed, at step 94, where the extracted netlist is compared to the design implementation created in step 84. LVS ensures that the design layout is a correct realization of the intended circuit topology. Any errors such as unintended connections between transistors, or missing connections/devices, etc. must be corrected in the design layout before proceeding to post-layout simulation, step 96. The post-layout simulation is performed using the extracted netlist which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and manufacturability and reliability of the circuit. For example, the density of a layer can be increased, additional vias added to interconnection areas, and the like. Creation of a design layout and performing DRC become critical time consuming processes. Performing a DRC and manipulation of the design layout often requires manual interaction from the designer. More reliable and automated techniques for improving the design layout are consistently desired.

In a modern semiconductor design technology, many metal layers are used to implement interconnections throughout an integrated circuit. For some integrated circuits, one or more polysilicon (poly) layers are also used to implement interconnections. Vias are used to connect from one such metal or polysilicon layer to another metal or polysilicon layer. For example, a via may be used to connect a feature (i.e., a design geometry) on each of two metal layers. The lower one of the two layers is referred to as the landing metal layer and the upper one of the two layers is referred to as the covering layer. A via between a landing metal layer $mt_x$ and the covering metal layer $mt_{x+1}$ is usually referred to as a $v_x$ via (i.e., using the same subscript designation as the landing metal layer).

Most design technologies include via enclosure rules to ensure that both the landing metal and the covering metal enclose the via by a certain amount. In other words, such an enclosure rule ensures that each metal layer overlaps a via with a certain amount of extra metal, to ensure that the via provides a good connection between the two metal layers once fabricated. The design rule specifying the extra amount of metal around each via may be referred to as a metal enclosure of a via design rule, and at times simply as a via enclosure design rule.

In a modern semiconductor design technology, especially for a deep sub-micron design, poly and metal layers which are used to implement connections through vias apply different via enclosure rules depending on the width of the metal or poly in the vicinity of the via. When a via is placed in a wide metal area, it may need more metal enclosure than that of a via which is placed in a narrower metal area. When a via is partially in wide metal area and partially in non-wide metal area, it may need different metal enclosure in each different area. In general, as the design technology advances, more and more wide classes of metal features may be used in a design layout, having different metal enclosure design rules for each wide metal class. Automated techniques are desirable for interacting with a design layout which includes multi wide class objects without causing false errors (or false passes), and additional improvements are needed.

SUMMARY

In a deep sub micron semiconductor design, vacancy concentration sometimes causes failure on single vias which are located at the center part of a wide landing metal or covering metal geometry, known as an isolated via. It has been observed that putting redundant vias between the same landing and covering metal as the isolated via, results in the vias sharing the vacancy load, so the risk of via failure is reduced. Vias which are close together (i.e., very proximal vias) and vias which are close to the edge of the metal geometry may also benefit from alteration of the stress gradients responsible for vacancy transport, and likewise reduce the risk of via failure. To avoid isolated vias, a redundant via design rule check is preferably performed on design layouts. In exemplary embodiments, a redundant via design rule check preferably ensures that for vias placed within a connection area of a metal feature (or within a localized region of a larger metal geometry) that is both greater than a certain width and greater than a certain area in size, the vias are both sufficient in number and/or proper in their location. Such redundant via checks may be performed on landing metal, on covering metal, or both.

In an exemplary embodiment, a redundant via design rule check requires that for a metal piece (or region of a piece) which is both greater than a certain width and greater than a certain area in size, any connection area within it (i.e., an area having at least one via connecting it to another metal layer) should contain at least a certain number of vias, some of which should be close to the landing metal edge or close to each other. The redundant via design rule may apply differently on different classes of objects which are defined by both minimum width and minimum area. In some embodiments, such a redundant via test may be waived for any connection area having at least a certain minimum number of vias therewithin.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
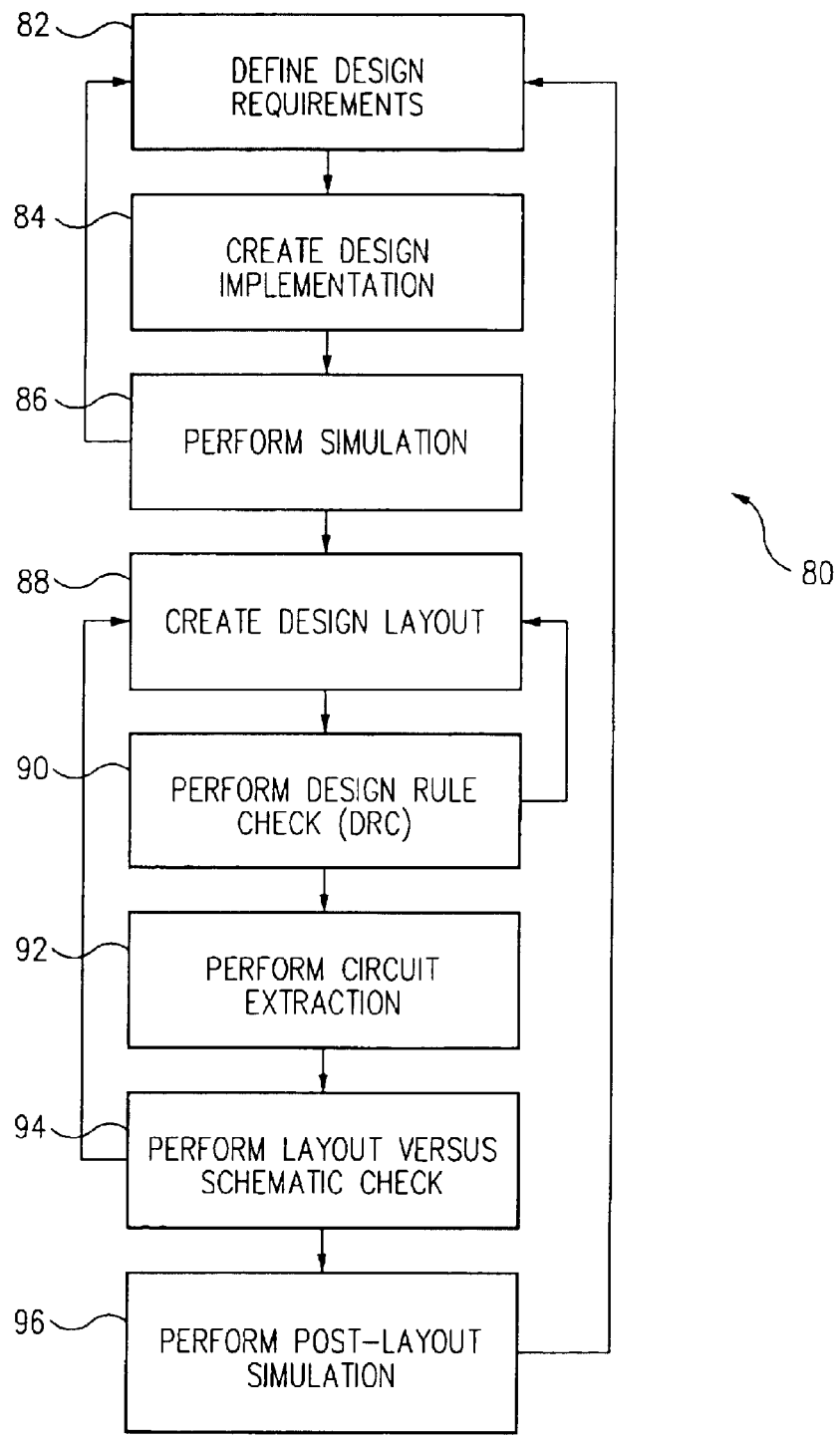
FIG. 1, labeled prior art, illustrates an exemplary design flow 80 for an integrated circuit device.

In many design flows, Electronic Design Automation (EDA) functions are used to extract Pure Fill Via Areas (PFVA) for each metal layer. A PFVA is an artificial object or geometry, which has been pre-shrunk from the original geometry by the correct enclosure amount, which depends on whether the PFVA is within a wide metal area or not. A via can be dropped (i.e., placed) anywhere within such a PFVA without violating the respective via metal enclosure rules. A Layer Pure Fill Via Area (LPFVA) is an area which meets the metal enclosure rule for the specific metal layer. In other words, a via can be placed anywhere inside the area without violating the specific metal enclosure design rule for any wide class. A $v_x$ PFVA is the common area of a $mt_x$ LPFVA and a $mt_{x+1}$ LPFVA. In this common area, a $v_x$ via meets metal enclosure design rules for both metal layers $mt_x$ and $mt_{x+1}$ anywhere. A LPFVA may be used for filling vias into the area without violating a specific metal layer enclosure design rule. Similarly, a $v_x$ PFVA may be used for filling $v_x$ vias into the area without violating a specific metal layer enclosure design rule on either the $mt_x$ or $mt_{x+1}$ metal layers. Additional details and preferred embodiments for extracting Pure Fill Via Areas is described in co-pending U.S. Application entitled "Pure Fill Via Area Extraction in a Multi-Wide Object Class Design Layout", by Li and filed on even date herewith, which application is incorporated by reference in its entirety.

In exemplary embodiments, a redundant via design rule check preferably checks each connection area within a region of a metal geometry that is both greater than a certain width and greater than a certain area in size, to ensure that vias placed within the connection area are both sufficient in number and/or proper in their location.

The following code illustrates an exemplary redundant via rule for a $v_x$ via layer.

| | | |
|---|---|---|
| 61 | VxMtIsovWidth = 1.80; | Min mt width for non isolated vx |
| 62 | VxMtIsovArea = 32.0; | Min mt area for non isolated vx |
| 63 | VxIsovToVx = 0.64; | Max spacing between two non isolated vx |
| 64 | VxIsovToMtEdge = 0.32; | Min enclosure for non isolated vx |
| 65 | VxMtIsovMinVia = 2; | Min vx for mt |
| 66 | VxMtWIsovWidth = 3.6; | 2nd wide mt for isolated via checking |
| 67 | VxMtWIsovArea = 127.0; | 2nd wide mt area isolated via checking |

| 68 VxMtWIsovMinVia = 3; | Min vx for 2nd wide mt |
| 69 VxIsovNotCheck = 6; | Min via not to check isolated via |
| 70 VxIsovMaxViaAdd = 10; | Max redundant vias to be placed |

These rule statements may be interpreted as follows. There are two wide classes of a metal layer mtx eligible for isolated via checks. The first class is for those mtx areas which meet a width greater than VxMtIsovWidth and which meet an area greater than VxMtIsovArea. Any mtx+1 overlapping with those areas and having at least one via (thus defining a connection area) should have at least VxMtisovMinVia (e.g., two) vias which should meet at least one of the following two rules: (1) the two vias are separated from each other by no more than VxIsovToVx, or (2) at least one of the vias is within the range of VxIsovToMtEdge to the $mt_x$ edge (i.e., "close" to the metal edge). The rule also specifies that whenever a connection area contains VxIsovNotCheck or more vias, the redundant via rule can be waived for this area, and further, if redundant vias are added by an automated routine, then no more than VxIsovMaxViaAdd such vias need be added. Each of these specific tests for a wide class may be termed a component test or constituent test for the class, and greater or fewer numbers of constituent tests may be employed for each wide class.

The second wide class is for those metal layer mtx areas which meet a width greater than VxMtw₁sovWidth and which meet an area greater than VxMtw₁sovArea. Any mtx+1 overlapping with those areas and having vias (i.e., a connection area) should have at least VxMtw₁sovMinVia (e.g., three) vias which should meet at least one of the following two rules: (1) at least two of the three vias are separated from each other by no more than VxIsovToVx, or (2) at least one of the vias is within the range of VxIsovToMtEdge to the mtx edge. The rule also specifies that whenever an mtx+1 area which is overlapping with the landing metal mtx (i.e., a connection area) contains VxIsovNotCheck or more vias, the redundant via rule can be waived for this area. Such specific numbers expressed are in the above rule are exemplary, and may be determined empirically for a particular semiconductor process. Other values are contemplated, as are other similar types of rule checks.

To perform an isolated via rule check (i.e., a "redundant via" rule check), the landing metal should preferably be separated into wide class object sets $w_0$, $w_1$, $w_2$, ... $w_n$ derived from the original geometries. Additional details and preferred embodiments for separating geometries of a layer into wide class object sets (i.e., wide class objects) is described in co-pending U.S. Application entitled "Structure and Method for Separating Geometries in a Design Layout into Multi-Wide Object Classes", by Li and Yang and filed on even date herewith, which application is incorporated by reference in its entirety.

Wide class objects are not real geometries, but rather are artificial objects. Although $w_0$ objects contain all real edges (i.e., non-virtual edges) which are coincident with the edges of the geometry, higher class objects ($w_1$, $w_2$, ... $w_n$ objects) can contain virtual edges. A virtual edge, as used herein, is defined as an edge or an edge segment of an artificial object that is not coincident with an edge of the geometry from which it was derived. In other words, a virtual edge is coincident with a wide class object edge and is inside the geometry from which it was derived. A virtual vertex, as used herein, is defined as a vertex on a wide class object formed by at least one virtual edge, but is not a real vertex on the geometry from which it was derived. Virtual edges and virtual vertices may together be referred to as forming a virtual boundary, while conversely, non-virtual edges (i.e., real edges) and non-virtual vertices (i.e., real vertices) may together be referred to as forming a non-virtual boundary (i.e., real boundary).

When deriving multiple wide class objects from a geometry, the rules for higher class objects preferably should not be applied to the virtual edges. Preferred algorithms to check the redundant via design rule advantageously treat virtual and non-virtual edges differently when deciding whether a particular via is a true isolated via.

An exemplary algorithm may be implemented by initially deriving all the $w_1$ objects from the $w_0$ objects, which may be accomplished by sizing down and sizing up each $w_0$ object (i.e., original geometry) by an amount equal to half of the VxMtIsovWidth value. Alternatively, the sizing factor may be set to an amount slightly less than half the VxMtIsovWidth value, such as an amount equal to the minimum design grid less than half the VxMtIsovWidth value. The area of each resulting object from these two sizing operations may then be computed, and those objects having an area of at least VxMtIsovArea are selected to form the set of $w_1$ objects.

Next, the $w_1$ objects are preferably extended by a predetermined amount, each edge extending outward, but only up to the extent of the $w_0$ object boundaries. For example, any $w_1$ edge falling inside a $w_0$ object is extended outward by up to this amount or until the extended edge reaches the $w_0$ object edge (if nearer than the extended amount). Since the non-virtual edges of the $w_1$ objects are already coincident with the $w_0$ object edges, only the virtual $w_1$ edges are extended, but only as far as the original $w_0$ object edges. The extended $w_1$ objects may be termed the base class object set $w_1$ (i.e., the extended $w_1$ object class) which is the base class eligible for the exemplary redundant via rule check.

The effect of extending the $w_1$ objects to form the $w_1$ base class is to include vias that are near, but not actually within, the $w_1$ objects, and to take these nearby vias into account, along with the other vias that are actually within the $w_1$ objects, in determining whether the $w_1$ object satisfies the redundant via test. The rationale for this inclusion is based upon observation that vias which are too far away from a $w_1$ object do not contribute to diffusing or sharing the vacancy load, but vias that are "relatively close" to a $w_1$ object do contribute to diffusing or sharing the vacancy load. The particular distance that each $w_1$ object is extended may be empirically determined for a given semiconductor process. In this exemplary technique, the $w_1$ objects are extended by a preferable amount sufficient to be able to include up to three additional minimum-spaced vias positioned just outside the $w_1$ object, but other extended amounts are contemplated as well. By extending the virtual edges of the $w_1$ objects outward by $3*ViaWidth+2*ViaToVia+ViaIsovToMtEdge$, we can treat the resulting edges of the base class $w_1$ objects as real edges as determined by the particular semiconductor process. The test for via spacing to an edge may then be performed using these $w_1$ base class edges (i.e., the extended $w_1$ objects). For other semiconductor processes, the resulting edges of the base class $w_1$ objects may not be able to be treated as real edges. Other values are also contemplated for extending the virtual edges of the $w_1$ objects outward, such as an amount corresponding to at least one properly enclosed via lying outside and adjacent to the non-extended virtual boundary of the $w_1$ objects.

Having derived the extended $w_1$ objects to be tested, the vias within the extended $w_1$ objects may then be tested for compliance to the redundant via rule. Using the exemplary redundant via rules described above as the example here, the vias within each extended $w_1$ object may be counted, and if equal in number to the maximum via count vxIsovNotCheck, the other isolated via rules may be waived and further tests not performed on the particular $w_1$ object. Otherwise, the vias within each extended $w_1$ object may be tested further. If two vias are "close enough" to each other (i.e., the spacing therebetween no greater than vxIsovToVx), the extended $w_1$ object passes. If the extended $w_1$ object contains more than one via, and at least one of the vias is within a certain distance vxIsovToMtEdge from the extended $w_1$ object edge, the extended $w_1$ object passes. Any via that fails to pass the redundant rule checks at this point is real failure. However, any passing via (or passing extended $w_1$ object) is not necessarily a real pass, because the vias within the extended $w_1$ object may fail a subsequent redundant via rule test performance on a higher class $w_1$ object.

Testing preferably continues with potentially a respective rule for each higher class of objects. In the exemplary embodiment currently described, the $w_2$ objects may be derived from the $w_1$ objects by sizing down and then sizing up by an amount equal to half of the vxMtWIsovWidth amount, and then keeping only those resulting objects whose area is at least vxMtIsovArea. (As before, such a sizing amount may alternatively be slightly less than half the vxMIsovWidth amount.) The derived $w_2$ objects might contain virtual edges relative to both the $w_1$ objects and the $w_0$ objects. For any virtual edge between $w_2$ and $w_0$, if it is also a virtual edge between $w_1$ and $w_0$, it has already been taken into account by extending the $w_1$ virtual edge. Preferably all the base class $w_1$ objects which overlap the derived $w_2$ objects are identified for the $w_2$ redundant via rule check. In other words, to proceed with the $w_2$ redundant via rule check, preferably each extended $w_1$ object which contains at least one $w_2$ object is identified.

Next, the $w_2$ redundant via rule check is preferably performed on those extended $w_1$ objects which contain at least one $w_2$ object. In the exemplary rule set, at least three vias are required in any connecting area between a lower layer of metal (i.e., landing metal layer) and an upper layer of metal. Of the at least three required vias, at least two of the vias should be separated by no more than vxIsovToVx, or one of the via should be placed within a distance of vxIsovToMtEdge to the mtx edge, for the vias within the object to pass. In this case the edge of the extended $w_1$ object being checked either corresponds to a real $w_0$ edge or to a $w_1$ extended virtual edge, which is treated as a real edge (e.g., as determined by the semiconductor process).

Figures 2A, 2B, 2C, 2D:
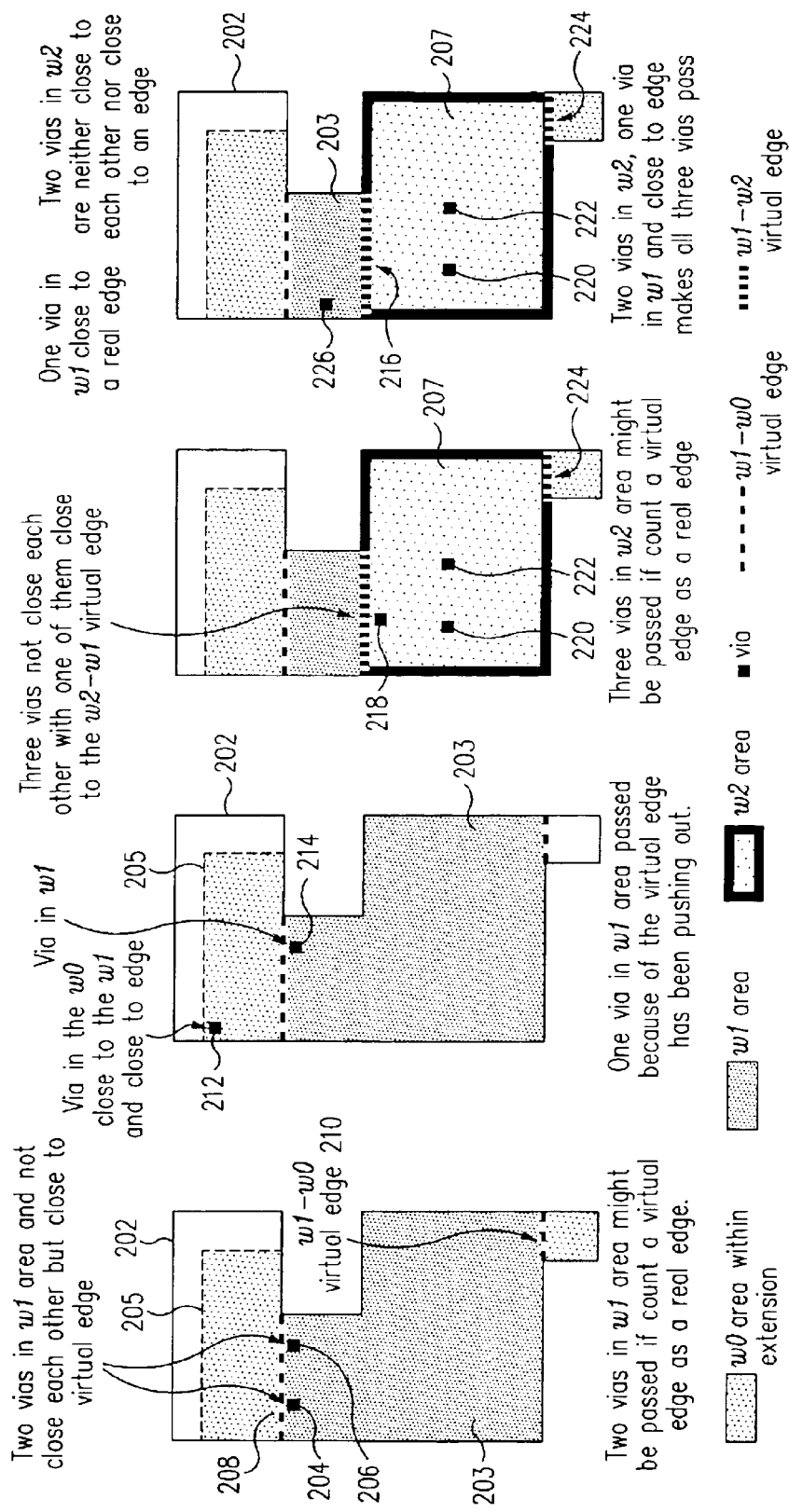
FIGS. 2A, 2B, 2C, and 2D depict four exemplary design layouts showing vias placed in locations relative to various wide class objects of a metal layer, to collectively better illustrate results of exemplary algorithms in accordance with the present invention.

Referring now to FIGS. 2A–2D, four respective examples are shown of vias placed relative to various wide class objects of a metal layer, to collectively better illustrate various situations and the results of such an exemplary algorithm. In the various figures, a geometry 202 is shown, along with a derived $w_1$ object area 203, and a derived $w_2$ object area 207. In FIG. 2A, there are two vias 204, 206 located within the $w_1$ object 203, and located very close to a virtual edge 208 between the $w_1$ object and the $w_0$ object 202 (i.e., a $w_1$ to $w_0$ virtual edge), but the vias 204, 206 are not close each other. In this case, if the virtual edge were treated as a real edge, the two vias would have passed the redundant via rule check. Preferably, however, both of them should be flagged as violations. This is accomplished in the exemplary rule check by extending the $w_1$ virtual edges by an amount sufficient to include three vias (for example) just outside the virtual edge, and then treating the extended $w_1$ edge 205 as a real edge. In this case, neither of the two vias 204, 206 are close enough to the extended $w_1$ virtual edge 205, and so the vias 204, 206 fail the test.

FIG. 2B shows a via 212 placed outside the $w_1$ object 203 virtual edge 208, but inside the $w_1$ extension area (i.e., inside the extended $w_1$ edge 205) and close to a real $w_0$ edge. There is only one via 214 placed within the $w_1$ object. If the $w_1$ virtual edge 208 were treated as a real edge, this via would have been flagged as a violation because only one via is placed within the $w_1$ object. Preferably, the two vias 212, 214 should pass the $w_1$ redundant via rule check. By extending the $w_1$ edge by an amount sufficient to include the second via 212, which is located sufficiently close to a real edge, the vias 212, 214 pass.

FIG. 2C shows the same $w_0$ object 202 and the derived $w_1$ object 203, and also shows a derived $w_2$ object 207. A $w_2$ to $w_1$ virtual edge 216 is shown between the $w_2$ object 207 and the $w_1$ object 203 which is not also a $w_2$ to $w_0$ virtual edge, whereas a $w_2$ to $w_1$ virtual edge 224 is shown which is also a $w_2$ to $w_0$ virtual edge 210. Note that there are three vias 218, 220, 222 placed within the $w_2$ object, and no two of them are close to each other. However, one of the vias (via 218) is close to a $w_2$ to $w_1$ virtual edge 216. If the virtual edge 216 were treated as a real edge, these three vias would have passed a $w_2$ redundant via rule check. Preferably, however, they should be flagged as violations. Moreover, these three vias 218, 220, 222 would even not pass the exemplary $w_1$ redundant via rule check described above, because none of them is within a distance vxIsovToMtEdge of a real edge, and no two of them are within a distance vxIsovToVx of each other.

FIG. 2D shows that the same two vias 220, 222 placed within the $w_2$ object, but they are neither close to each other, nor close to any real edge. Also there is a third via 226 placed outside the $w_2$ object but inside the $w_1$ object and very close to a real edge. If the $w_2$ virtual edge 216 were treated as a real edge, and therefore only the two vias 220, 222 within the $w_2$ object are considered, these two vias 220, 222 would have been flagged as violations. In the exemplary rule check described herein, these three vias 220, 222, 226 should pass the $w_2$ redundant via rule check because the checking object is the base class extended $w_1$ object 205 which is overlapping the $w_2$ object. As can be appreciated, these three vias 220, 222, 226 would have already passed the $w_1$ redundant via rule check.

Figure 3:
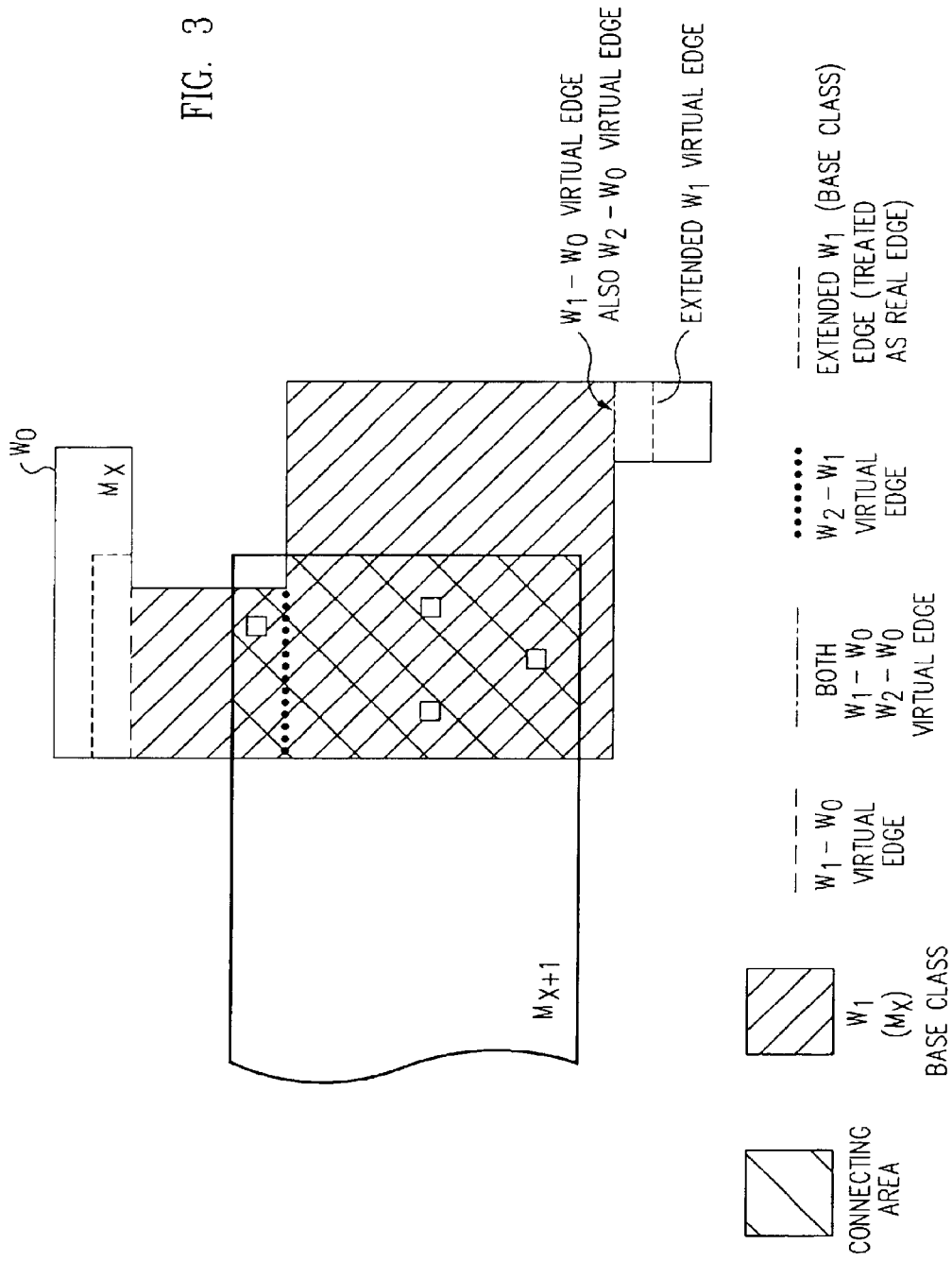
FIG. 3 depicts a design layout showing vias placed in locations relative to various wide class objects of a landing metal $m_x$ layer, and illustrates a connection area formed with a covering metal $m_{x+1}$ layer.

FIG. 3 depicts a design layout showing vias placed in locations relative to various wide class objects of a landing metal $m_x$ layer, and illustrates a connection area formed with a covering metal $m_{x+1}$ layer. While the wide object classes are depicted on the landing metal $m_x$ layer, it is also desirable to perform redundant via testing using the covering metal, which may define wide object classes differently than the landing metal, and may have different redundant via rule sets for each wide class definition. In the algorithms and techniques described herein, reference to a metal layer may include either layer, or both layers, as the context may require.

In an n wide class design rule, for $w_i$ ($0 < i <= n$), an exemplary algorithm may be generalized as follows:

1. Derive the $w_i$ objects from the $w_{i-1}$ objects using the respective minimum width vxMtIsovWidth and the respective minimum area vxMtIsovArea for the wide class.
2. For the $w_i$ objects, derive the base class objects by extending the $w_i$ virtual edges outward by a predetermined amount, resulting in the extended $w_i$ objects.
3. Perform the $w_i$ redundant via rule check on those $w_i$ base class objects which contain at least one $w_i$ object.

At least the respective minimum number $N_i$ of vias must be present within each connection area. Among them, at least $M_i$ of them must be separated by no more than vxIsovToVx, or one of the via is within the range of vxIsovToMtEdge to the mtx edge. In this case the edge is either the real $w_0$ edge or the $w_1$ extended virtual edge, which is treated as a real edge.

The use herein of a convenient set nomenclature such as "a plurality of wide class object sets $w_0, w_1, w_2, \ldots w_n$" need not imply that n must be greater than 2. Rather, n may be equal to 1, in which case there need be only one wide class of objects in addition to the original design geometries themselves, which are represented by the $w_0$ class. Moreover, n may alternatively be equal to 2 or more than 2.

As used herein, stretching an edge by a positive amount elongates the length of the edge while stretching an edge by a negative amount shortens the length of the edge. In contrast, sizing an edge creates a rectangular area. Sizing is typically performed in the outward direction (i.e., "sizing up," or away from the center of the object from which the edge was derived, by specifying a positive amount), although at times may be toward the center of the object (i.e., "sizing down," or toward the center of the object, by specifying a negative amount).

It is appreciated that operations discussed herein may consist of directly entered commands by a computer system user, but the preferred embodiment includes steps executed by software modules. The functionality of step referred to herein may correspond to the functionality of modules or portions of modules. In addition to software modules, the above flows or portions of flows can be implemented as application instructions or menu items. For example, a sizing operation which only sizes non-virtual edges of an object by a sizing factor can be an application instruction provided by an EDA tool provider according to some embodiments of the present invention.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention. Line numbers on exemplary code sections or modules are used for ease of reference, and should not be taken to require any particular order between separately described modules.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

Although the above embodiments have been described in relation to Cadence EDA tools and code segments utilizing Diva language code, the techniques described herein can be applicable to and make use of any EDA tools, electronic circuit layout, and implemented in any code language. Moreover, although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for testing enclosure of vias by geometries of a design layout, said vias connecting geometries of a first layer to geometries of a second layer, said method comprising the steps of:

representing geometries on the first layer by a $w_0$ set of objects;

for i=1, n:

deriving a wide class $w_i$ object set;

identifying $W_i$ connection areas between the first layer and the second layer, each having at least one via located within a $w_i$ object of the first layer;

performing a $w_i$ redundant via test on each identified $w_1$ connection area, said, $w_i$ redundant via test performed relative to a base class $w_i$ object set containing the identified $w_i$ connection area, said base class $w_1$ formed by extending virtual edges of $w_i$ objects inside of $w_0$ objects; and marking vias that fail the $w_i$ redundant via test as a violation.

2. The method as recited in claim 1 wherein the deriving step comprises:

deriving $w_i$ objects by at least sizing $w_{i-1}$ objects inward and back outward by at most half of a respective minimum width rule for the $w_i$ objects.

3. The method as recited in claim 1 wherein the deriving step further comprises:

selecting those inward and back outward sized $w_{i-1}$ objects that have at least a respective minimum area rule for the $w_i$ objects.

4. The method as recited in claim 1 wherein n equals 1.

5. The method as recited in claim 1 wherein n equals at least 2.

6. The method as recited in claim 1 wherein the step of performing a $w_i$ redundant via test on each identified $w_i$ connection area is performed relative to the base class $w_i$ objects containing at least one $w_i$ object.

7. The method as recited in claim 1 wherein each $w_i$ redundant via test comprises a constituent test that is failed for a given $w_i$ connection area if less than a respective minimum number of vias are located within the given $w_i$ connection area.

8. The method as recited in claim 1 wherein each $w_i$ redundant via test comprises a constituent test that waives all other $w_i$ redundant via constituent tests for a given $w_i$ connection area if at least a respective certain number of vias are located within the given $w_i$ connection area.

9. The method as recited in claim 1 wherein each $w_i$ redundant via test comprises a constituent test that is passed for a given $w_1$ connection area if at least a respective minimum number of vias are located within the given $w_i$ connection area and each of at least a predetermined subset of such vias is located within a respective maximum distance from a boundary of the base class $w_1$ object containing the vias.

10. The method as recited in claim 1 wherein each $w_i$ redundant via test comprises a constituent test that is passed for a given $w_i$ connection area if at least a respective certain number of vias within the given $w_i$ connection area are located no farther apart than a respective maximum distance.

11. A method for testing via enclosure by geometries of a design layout, said vias connecting geometries of a first layer to geometries of a second layer, said method comprising the steps of:

representing geometries on the first layer by a $w_0$ set of objects;

deriving $w_i$ objects corresponding to the $w_i$ objects;

extending virtual edges of $w_1$ objects outward by up to a predetermined amount to generate extended $w_1$ objects as base class $w_1$ objects;

identifying $w_1$ connection areas between the first layer and the second layer, each having at least one via located within a base class $w_1$ object of the first layer;

performing a $w_1$ redundant via test on vias within each identified $w_1$ connection area, said a $w_1$ redundant via test performed relative to the base class $w_1$ objects; and marking vias within any $w_1$ connection area which fails the $w_1$ redundant via test as a violation.

12. The method as recited in claim 11 wherein the deriving step comprises:

at least sizing the $w_0$ objects inward and back outward by at most half of a respective minimum width rule for the $w_i$ objects.

13. The method as recited in claim 11 wherein at least one of the first and second layers represents a metal layer on an integrated circuit layout.

14. The method as recited in claim 11 wherein the virtual boundaries of the $w_1$ objects are extended by at least an amount corresponding to at least one properly enclosed via lying outside and adjacent to the non-extended virtual boundary of the $w_1$ objects.

15. The method as recited in claim 11 wherein the step of deriving a wide class $w_i$ comprises eliminating any tentative $w_i$ object having less than a respective minimum area for the $w_i$ class.

16. The method as recited in claim 11 wherein the step of extending the $w_1$ objects comprises the steps of:

sizing the $w_1$ objects outward by the predetermined amount; and eliminating portions of the sized $w_1$ objects extending outside the $w_0$ objects.

17. The method as recited in claim 11 further comprising the steps of:

deriving the next higher numbered wide class object set $w_i$;

identifying $w_i$ connection areas between the first layer and the second layer, each having at least one via located within a $w_i$ object of the first layer;

performing a $w_i$ redundant via test on each identified $w_i$ connection area, said $w_i$ redundant via test performed relative to the base class $w_i$ objects;

marking vias within any $w_i$ connection area which fails the $w_i$ redundant via test as a violation; and performing the above steps for each wide class object set.

18. The method as recited in claim 17 wherein the step of performing a $w_i$ redundant via test on each identified $w_i$ connection area is performed relative to the base class $w_i$ objects containing at least one $w_i$ object.

19. The method as recited in claim 17 wherein each $w_i$ redundant via test comprises a constituent test that is failed for a given $w_i$ connection area if less than a respective minimum number of vias are located within the given $w_i$ connection area.

20. The method as recited in claim 17 wherein each $w_i$ redundant via test comprises a constituent test that waives all other $w_i$ redundant via constituent tests for a given $w_i$ connection area if at least a respective certain number of vias are located within the given $w_i$ connection area.

21. The method as recited in claim 17 wherein each $w_1$ redundant via test comprises a constituent test that is passed for a given $w_1$ connection area if at least a respective minimum number of vias are located within the given $w_1$ connection area and each of at least a predetermined subset of such vias is located within a respective maximum distance from a boundary of the base class $w_1$ object containing the vias.

22. The method as recited in claim 17 wherein each $w_i$ redundant via test comprises a constituent test that is passed for a given $w_i$ connection area if at least a respective certain number of vias within the given $w_i$ connection area are located no farther apart than a respective maximum distance.

23. The method as recited in claim 17 wherein the first layer comprises a landing metal layer of the design layout.

24. The method as recited in claim 17 wherein the first layer comprises a covering metal layer of the design layout.

25. The method as recited in claim 17 wherein each $w_i$ redundant via test comprises:

a constituent test that waives all other $w_i$ redundant via constituent tests for a given $w_i$ connection area if at least a respective certain number of vias are located within the given $w_i$ connection area;

a constituent test that is failed for a given $w_i$ connection area if less than a respective minimum number of vias are located within the given $w_i$ connection area;

a constituent test that is passed for a given $w_i$ connection area if at least a respective minimum number of vias are located within the given $w_i$ connection area and each of at least a predetermined subset of such vias is located within a respective maximum distance from a boundary of the base class $w_1$ object containing the vias; and a constituent test that is passed for a given $w_i$ connection area if at least a respective certain number of vias within the given $w_i$ connection area are located no farther apart than a respective maximum distance.

26. A method of making a computer readable media product that encodes a design file representation of a design layout of an electronic circuit, said design layout having vias connecting geometries of a first layer to geometries of a second layer, said method comprising the steps of:

representing geometries on the first layer by a $w_0$ set of objects;

for i=1, n:

deriving a wide class $w_i$ object set;

identifying $w_i$ connection areas between the first layer and the second layer, each having at least one via located within a $w_i$ object of the first layer;

performing a $w_i$ redundant via test on each identified $w_i$ connection area, said $w_i$ redundant via test performed relative to a base class $w_i$ object set containing the identified $w_i$ connection area, said base class $w_1$ formed by extending virtual edges of $w_1$ objects inside of $w_0$ objects; and identifying vias that fail the $w_i$ redundant via test; and correcting the identified failing vias.

27. The method as recited in claim 26 wherein the deriving step comprises:

deriving $w_1$ objects by at least sizing $w_{i-1}$ objects inward and back outward by at most half of a respective minimum width rule for the $w_i$ objects; and selecting those inward and back outward sized $w_{i-1}$ objects that have at least a respective minimum area rule for the $w_i$ objects.

28. The method as recited in claim 26 wherein the step of performing a $w_i$ redundant via test on each identified $w_i$ connection area is performed relative to the base class $w_1$ objects containing at least one $w_i$ object.

29. The method as recited in claim 26 wherein at least one of the first and second layers represents a metal layer on an integrated circuit layout.

30. The method as recited in claim 26, wherein the computer readable media product is embodied as one or more media selected from the set of a disk, tape, or other magnetic, optical, semiconductor or electronic storage medium and a network, wire line, wireless or other communications medium.

31. A method of processing one or more design files for an electronic circuit, the one or more design files encoding representations of a design layout of the electronic circuit, said design layout having vias connecting geometries of a first layer to geometries of a second layer, said method comprising the steps of:

representing geometries on the first layer by a $w_0$ set of objects;

for i=1, n:

deriving a wide class $w_i$ object set;

identifying $w_i$ connection areas between the first layer and the second layer, each having at least one via located within a $w_i$ object of the first layer;

performing a $w_i$ redundant via test on each identified $w_i$ connection area, said $w_i$ redundant via test performed relative to a base class $w_1$ object set containing the identified $w_i$ connection area, said base class $w_1$ formed by extending virtual edges of $w_1$ objects inside of $w_0$ objects; and identifying vias that fail the $w_i$ redundant via test as violations.

32. The method as recited in claim 31 wherein the deriving step comprises:

deriving $w_i$ objects by at least sizing $w_{i-1}$ objects inward and back outward by at most half of a respective minimum width rule for the $w_i$ objects; and selecting those inward and back outward sized $w_{i-1}$ objects that have at least a respective minimum area rule for the $w_i$ objects.

33. The method as recited in claim 31 wherein the step of performing a $w_i$ redundant via test on each identified $w_i$ connection area is performed relative to the base class $w_1$ objects containing at least one $w_i$ object.

34. An electronic circuit fabricated from a design layout representation thereof, said design layout having vias connecting geometries of a first layer to geometries of a second layer, said design layout being generated by the steps of:

representing geometries on the first layer by a $w_0$ set of objects;

for i=1, n:

deriving a wide class $w_i$ object set;

identifying $w_i$ connection areas between the first layer and the second layer, each having at least one via located within a $w_i$ object of the first layer;

performing a $w_i$ redundant via test on each identified $w_i$ connection area, said $w_i$ redundant via test performed relative to a base class $w_1$ object set containing the identified $w_i$ connection area, said base class $w_i$ formed by extending virtual edges of $w_1$ objects inside of $w_0$ objects; and identifying vias that fail the $w_i$ redundant via test; and correcting the identified failing vias.

35. The electronic circuit as recited in claim 34 wherein the deriving step comprises:

deriving $w_i$ objects by at least sizing $w_{1-1}$ objects inward and back outward by at most half of a respective minimum width rule for the $w_i$ objects; and selecting those inward and back outward sized $w_{i-1}$ objects that have at least a respective minimum area rule for the $w_i$ objects.

36. The electronic circuit as recited in claim 34 wherein the step of performing a $w_i$ redundant via test on each identified $w_i$ connection area is performed relative to the base class $w_1$ objects containing at least one $w_i$ object.

37. The electronic circuit as recited in claim 34 wherein at least one of the first and second layers represents a metal layer on an integrated circuit layout.

38. A computer readable encoding of an electronic circuit design, the computer readable encoding comprising:

one or more design file media encoding representations of vias connecting geometries of a first layer to geometries of a second layer;

wherein the computer readable encoding of the electronic circuit design was generated by the steps of:

representing geometries on the first layer by a $w_0$ set of objects;

for i=1, n:

deriving a wide class $w_i$ object set;

identifying $w_i$ connection areas between the first layer and the second layer, each having at least one via located within a $w_i$ object of the first layer;

performing a $w_i$ redundant via test on each identified $w_i$ connection area, said wredundant via test performed relative to a base class $w_i$ object set containing the identified $w_i$ connection area, said base class $w_1$ formed by extending virtual edges of $w_1$ objects inside of $w_0$ objects; and identifying vias that fail the $w_1$ redundant via test; and correcting the identified failing vias.

39. The computer readable encoding as recited in claim 38 wherein the deriving step comprises:

deriving $w_i$ objects by at least sizing $w_{i-1}$ objects inward and back outward by at most half of a respective minimum width rule for the $w_i$ objects; and selecting those inward and back outward sized $w_{i-1}$ objects that have at least a respective minimum area rule for the $w_i$ objects.

40. The computer readable encoding as recited in claim 38 wherein the step of performing a $w_i$ redundant via test on each identified $w_i$ connection area is performed relative to the base class $w_1$ objects containing at least one $w_i$ object.

41. The computer readable encoding as recited in claim 38 wherein at least one of the first and second layers represents a metal layer on an integrated circuit layout.

42. An apparatus for processing one or more design files for an electronic circuit, the one or more design files encoding representations of a design layout of the electronic circuit, said design layout having vias connecting geometries of a first layer to geometries of a second layer, said apparatus comprising:

means for deriving wide object classes $w_0, w_1, \ldots, w_n$ corresponding to the first layer;

means for identifying $w_i$ connection areas between the first layer and the second layer for each wide class $w_i$ object set, each having at least one via located within a $w_i$ object of the first layer;

means for performing a $w_i$ redundant via test on each identified $w_i$ connection area, said $w_i$ redundant via test performed relative to a base class $w_1$ object set containing the identified $w_i$ connection area, said base class $w_1$ formed by extending virtual edges of $w_1$ objects inside of $w_0$ objects; and means for identifying vias that fail the $w_i$ redundant via test as violations.

43. The apparatus as recited in claim 34 wherein the means for deriving comprises:

means for deriving $w_i$ objects by at least sizing $w_{i-1}$ objects inward and back outward by at most half of a respective minimum width rule for the $w_i$ objects; and means for selecting those inward and back outward sized $w_{i-1}$ objects that have at least a respective minimum area rule for the $w_i$ objects.

44. The apparatus as recited in claim 34 wherein the $w_i$ redundant via test is performed on each identified $w_i$ connection area relative to the base class $w_1$ objects containing at least one $w_i$ object.

45. A computer readable encoding of instructions for a computer, said instructions encoding a method for use with a design layout, for testing enclosure of vias by geometries of a design layout, said vias connecting geometries of a first layer to geometries of a second layer, said encoded method comprising the steps of:

representing geometries on the first layer by a $w_0$ set of objects;

for i=1, n:

deriving a wide class $w_i$ object set;

identifying $w_i$ connection areas between the first layer and the second layer, each having at least one via located within a $w_i$ object of the first layer;

performing a $w_i$ redundant via test on each identified $w_i$ connection area, said $w_i$ redundant via test performed relative to a base class $w_1$ object set containing the identified $w_i$ connection area, said base class $w_1$ formed by extending virtual edges of $w_1$ objects inside of $w_0$ objects; and marking vias that fail the $w_i$ redundant via test as a violation.

46. The computer readable encoding as recited in claim 45 wherein the encoded step of performing a $w_i$ redundant via test on each identified $w_i$ connection area is performed relative to the base class $w_1$ objects containing at least one $w_i$ object.

* * * * *

UNITED STATES PATENT AND TRADEMARK OFFICE
CERTIFICATE OF CORRECTION

PATENT NO. : 6,804,808 B2
DATED : October 12, 2004
INVENTOR(S) : Mu-Jing Li and Amy Yang It is certified that error appears in the above-identified patent and that said Letters Patent is hereby corrected as shown below:

Column 5,
Line 11, the word "VxMtisovMinVia" should read -- VxMtIsovMinVia --.
Line 29, the word "VxMtw$_1$sovMinVia" should read -- VxMtWIsovMinVia --.

Column 7,
Line 18, the word "$w_1$" should read -- $w_i$ --.

Column 10,
Line 51, the word "$w_1$ connection area, said, " should read -- $w_i$ connection area, said --.
Lines 52 and 55, the word "$w_i$" should read -- $w_1$ --.

Column 11,
Line 6, the word "$w_i$" should read -- $w_1$ --.
Line 19, the word "$w_1$" should read -- $w_i$ --.
Line 36, the words "deriving $w_i$ objects corresponding to the $w_i$ objects;" should read -- deriving $w_1$ objects corresponding to the $w_0$ objects; --.
Line 44, the words "said a $w_1$" should read -- said $w_1$ --.

Column 12,
Lines 15 and 21, the word "$w_i$" should read -- $w_1$ --.
Lines 33, 35 and 36, the word "$w_1$" should read -- $w_i$ --.

Column 13,
Line 18, the word "$w_i$" should read -- $w_1$ --.
Line 26, the word "$w_1$" should read -- $w_i$ --.

Column 14,
Lines 29 and 64, the word "$w_i$" should read -- $w_1$ --.
Line 35, the word "$w_{1-1}$" should read -- $w_{i-1}$ --.
Line 63, the words said wredundant" should read -- said $w_i$ redundant --.

Column 15,
Line 1, the word "$w_1$" should read -- $w_i$ --.

UNITED STATES PATENT AND TRADEMARK OFFICE
CERTIFICATE OF CORRECTION

PATENT NO. : 6,804,808 B2
DATED : October 12, 2004
INVENTOR(S) : Mu-Jing Li and Amy Yang It is certified that error appears in the above-identified patent and that said Letters Patent is hereby corrected as shown below:

<u>Column 16,</u>
Lines 1 and 9, replace "34" with -- 42 --.

Signed and Sealed this

Fifteenth Day of March, 2005

JON W. DUDAS
*Director of the United States Patent and Trademark Office*